United States Patent
Wang

(10) Patent No.: US 9,755,646 B2
(45) Date of Patent: Sep. 5, 2017

(54) INPUT/OUTPUT BUFFER CIRCUIT FOR AVOIDING MALFUNCTIONING IN PROCESSING SIGNALS

(71) Applicant: Nuvoton Technology Corporation, Hsinchu (TW)

(72) Inventor: Cheng-Chih Wang, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 0 days.

(21) Appl. No.: 15/011,653

(22) Filed: Jan. 31, 2016

(65) Prior Publication Data

US 2016/0269030 A1    Sep. 15, 2016

(30) Foreign Application Priority Data

Mar. 10, 2015   (TW) ................... 104107614

(51) Int. Cl.
  *H03K 3/00*        (2006.01)
  *H03K 19/173*      (2006.01)
  *H03K 19/0185*     (2006.01)

(52) U.S. Cl.
  CPC ... *H03K 19/173* (2013.01); *H03K 19/018507* (2013.01)

(58) Field of Classification Search
  CPC ............. H03K 19/173; H03K 19/018507
  See application file for complete search history.

(56) References Cited

U.S. PATENT DOCUMENTS

| | | | |
|---|---|---|---|
| 5,132,987 A * | 7/1992 | Motohashi | H04L 5/1461 178/70 R |
| 6,507,215 B1 | 1/2003 | Piasecki et al. | |
| 6,834,318 B2 * | 12/2004 | Hunter | G06F 13/4045 326/86 |
| 7,061,274 B2 * | 6/2006 | George | H03K 19/01759 326/62 |
| 7,446,560 B2 | 11/2008 | Balasubramanian et al. | |
| 7,639,045 B2 * | 12/2009 | Motamed | H03K 19/01859 326/82 |
| 8,217,700 B1 | 7/2012 | Williams et al. | |
| 8,601,254 B1 | 12/2013 | Kutz et al. | |
| 8,942,027 B1 * | 1/2015 | Chuang | G11C 14/009 365/148 |
| 9,117,521 B2 * | 8/2015 | Guillemenet | G11C 11/161 |

* cited by examiner

*Primary Examiner* — Kenneth B Wells
(74) *Attorney, Agent, or Firm* — CKC & Partners Co., Ltd.

(57) ABSTRACT

An input/output (I/O) buffer circuit includes an I/O unit, a first register and a second register. The I/O unit selectively transmits digital signals and analog signals according to a first enable signal, and selectively receives signals and outputs signals at an I/O terminal according to a second enable signal. The first register latches a first control signal received before power is turned off, and outputs the first enable signal corresponding to the first control signal to the I/O unit when power is turned on. The second register latches a second control signal received before power is turned off, and outputs the second enable signal corresponding to the second control signal to the I/O unit when power is turned on.

14 Claims, 4 Drawing Sheets

INPUT/OUTPUT BUFFER CIRCUIT FOR AVOIDING MALFUNCTIONING IN PROCESSING SIGNALS

RELATED APPLICATIONS

This application claims priority to Taiwanese Application Serial Number 104107614, filed Mar. 10, 2015, which is herein incorporated by reference.

BACKGROUND

Technical Field

The present disclosure relates to a circuit. More particularly, the present disclosure relates to an input/output (I/O) circuit.

Description of Related Art

The current technology is such that integrated circuit (ICs) can be used to execute various different types of operations simultaneously. The capability of ICs may be enhanced by packaging more circuits in one chip or by integrating circuits with different purposes in one element. For example, a control chip may include digital circuits and analog circuits to process digital signals and analog signals, and to perform corresponding functions.

However, in a state where it is desired for the above-mentioned chip to process analog signals through the I/O terminal, because the chip is typically preset to perform digital processing when power is first turned on, the chip usually needs to pass through a digital processing stage before entering an analog processing stage. Consequently, the above-mentioned chip is unable to perform analog processing immediately when power resumes, which may result in malfunctioning with respect to the processing of signals.

SUMMARY

One embodiment of the present disclosure is related to an input/output (I/O) buffer circuit. The I/O buffer circuit comprises an I/O unit, a first register and a second register. The I/O unit selectively transmits digital signals and analog signals according to a first enable signal, and selectively receives signals and outputs signals at an I/O terminal according to a second enable signal. The first register latches a first control signal received before power is turned off, and outputs the first enable signal corresponding to the first control signal to the I/O unit when power is turned on. The second register latches a second control signal received before power is turned off, and outputs the second enable signal corresponding to the second control signal to the I/O unit when power is turned on.

Another embodiment of the present disclosure is related to an I/O buffer circuit. The I/O buffer circuit comprises a first non-volatile register, a second non-volatile register and an I/O unit. The first non-volatile register outputs a first enable signal when a power-off state resumes to a power-on state. The second non-volatile register outputs a second enable signal when the power-off state resumes to the power-on state. The I/O unit, in a state where the first enable signal and the second enable signal separately have a predetermined logic level, is configured to be controlled by the first enable signal and the second enable signal to receive and deliver an analog input signal to an input terminal when the power-off state resumes to the power-on state.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawing as follows.

DETAILED DESCRIPTION

Figure 1:
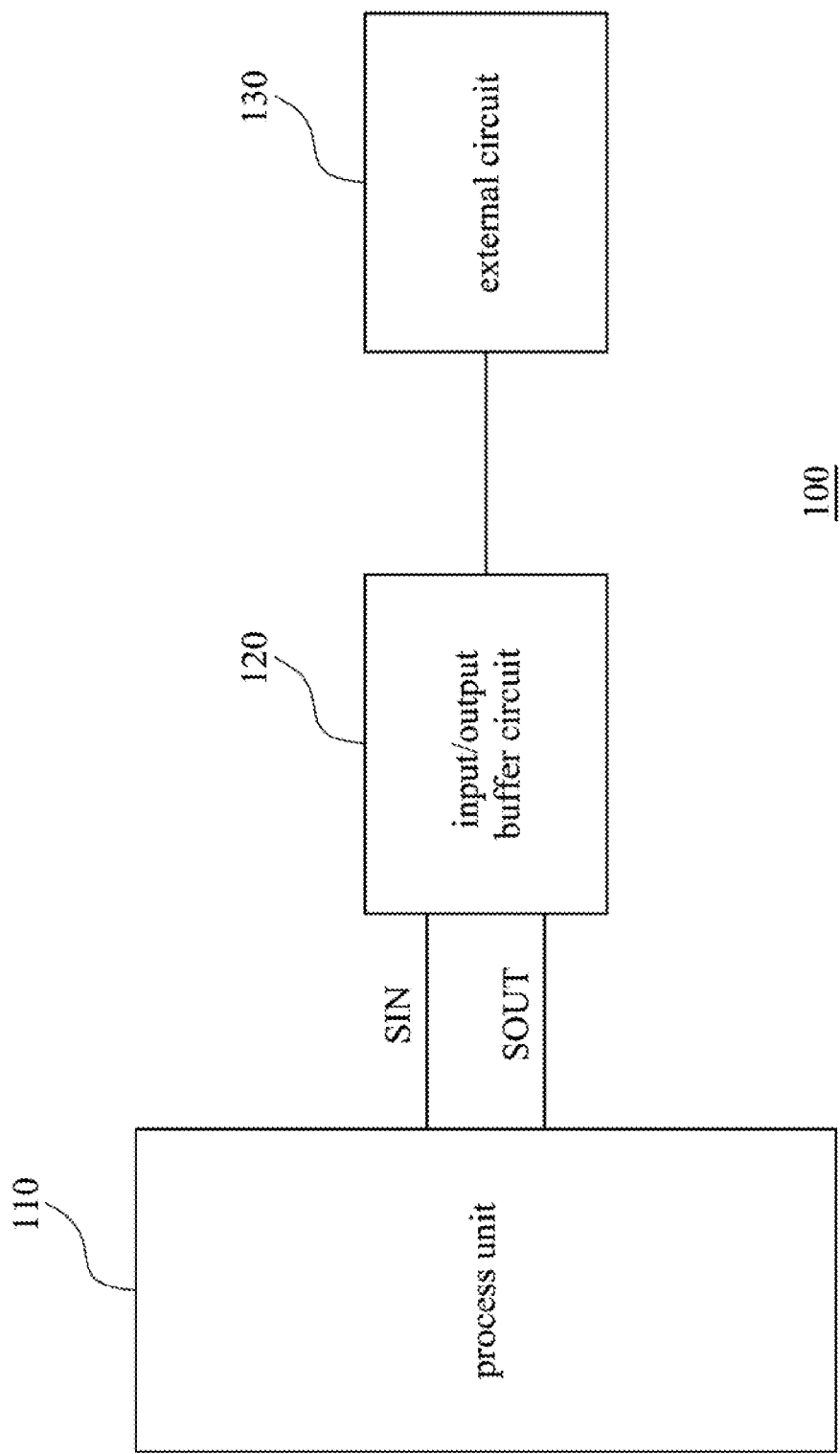
FIG. 1 is block diagram illustrating a circuit system according to embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

Moreover, the drawings are for the purpose of illustration only, and are not in accordance with the size of the original drawing. The same or similar components in description are described with the same number to understand.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

As used herein, "around," "about" or "approximately" shall generally mean within 20 percent, preferably within 10 percent, and more preferably within 5 percent of a given value or range. Numerical quantities given herein are approximate, meaning that the term "around," "about" or "approximately" can be inferred if not expressly stated.

As used herein with respect to "first," "second," etc., these terms do no indicate a special order or have any type of special meaning, and instead are simply used to distinguish the operation described in the same terms or elements of it.

Secondly, the terms "comprise," "comprising," "including," "has," "having," etc. used in this specification are open-ended and mean "comprises but not limited."

In addition, the term "coupled" may also be termed as "electrically coupled", and the term "connected" may be termed as "electrically connected". "Coupled" and "connected" may also be used to indicate that two or more elements cooperate or interact with each other.

FIG. 1 is a block diagram illustrating a circuit system according to embodiments of the present disclosure. As illustrated in FIG. 1, a circuit system 100 includes a process unit 110, an input/output (I/O) buffer circuit 120 and an external circuit 130. The I/O buffer circuit 120 is electrically coupled between the process unit 110 and the external circuit 130, and is configured to be a signal-transmitting link between the process unit 110 and the external circuit 130, such that the process unit 110 may receive an input signal SIN from the external circuit 130 through the I/O buffer circuit 120, or transmit an output signal SOUT to the external circuit 130 through the I/O buffer circuit 120.

In some embodiments, the process unit 110 may be a microprocessor a central processing unit (CPU), a digital signal processor (DSP), an application-specific integrated circuit (ASIC), or similar control signal-processing element, or the combination thereof. In other embodiments, the external circuit 130 may be any circuit disposed outside the process unit 110 and which communicates with the process unit 110 to perform corresponding operations.

In various embodiments, an input/output pad (I/O pad) (not shown in drawings) may be disposed between the I/O buffer circuit 120 and the external circuit 130. The I/O buffer circuit 120 and the I/O pad set up the signal-transmitting link between the process unit 110 and the external circuit 130.

In addition, as illustrated in FIG. 1, the I/O buffer circuit 120 is disposed outside the process unit 110, but in other embodiments, the I/O buffer circuit 120 may be disposed in the same chip together with the process unit 110. The configuration of the I/O buffer circuit 120 is not limited to that illustrated in FIG. 1.

Figure 2:
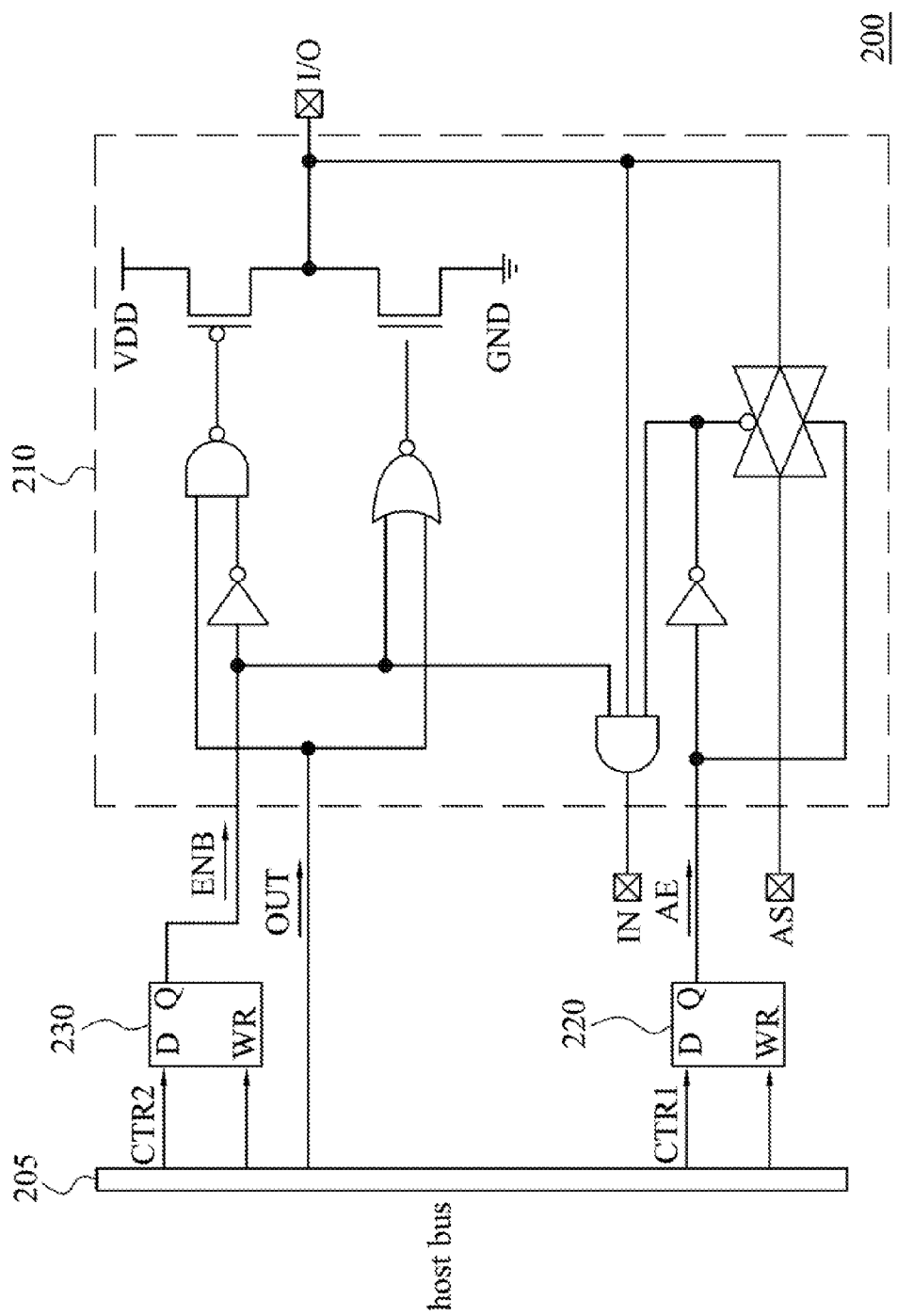
FIG. 2 is a schematic circuit diagram illustrating an input/output buffer circuit according to embodiments of this disclosure.

FIG. 2 is a schematic circuit diagram illustrating an input/output buffer circuit according to embodiments of this disclosure. The I/O buffer circuit 200 illustrated in FIG. 2 may be implemented in the circuit system 100 illustrated in FIG. 1, but is not limited thereto.

As illustrated in FIG. 2, the I/O buffer circuit 200 may include an I/O unit 210, and registers 220, 230. The I/O unit 210 may be configured to selectively transmit digital signals and analog signals according to an enable signal AE, and selectively receive signals and output signals at the input/output terminal I/O according to an enable signal ENB.

The register 220 may be configured to output the enable signal AE to control the I/O unit 210 when the register 220 is changed from a power-off state to a power-on state (for example, the register 220 receives power to be in normal functioning). In some embodiments, the register 220 may be configured to receive a control signal CTR1 from a host bus 205, and latch the control signal CTR1 before power is turned off (for example, the power supplied to the register 220 is stopped or accidently has a voltage drop resulting in power-off of the register 220), and output the enable signal AE corresponding to the control signal CTR1 to the I/O unit 210 when power is turned on (for example, the register 220 receives power to be in normal functioning).

In addition, the register 230 may be configured to output the enable signal ENB to control the I/O unit 210 when the power-off state resumes to the power-on state (for example, the register 230 receives power to be in normal functioning). In some embodiments, the register 230 may be configured to receive a control signal CTR2 from the host bus 205, and latch the control signal CTR2 when power is turned off (for example, the power supplied to the register 230 is stopped or accidently has a voltage drop resulting in power-off of the register 230), and output the enable signal ENB corresponding to the control signal CTR2 to the I/O unit 210 when power is turned on (for example, the register 230 receives power to be in normal functioning).

Consequently, the registers 220 and 230 may store the control signals corresponding to the last operation stage when power is turned off, and separately and immediately output the enable signals AE and ENB corresponding to the last operation stage when the power-off state resumes to the power-on state. Hence, the I/O unit 210 may be controlled by the enable signals AE and ENB corresponding to the last operation stage to transmit analog signals instead of waiting to pass through the digital processing stage to enter the analog processing stage.

For the operation of the I/O buffer circuit 200 in some embodiments, in a state where the enable signal AE has a logic level 0, the I/O unit 210 may perform the transmission of digital signals according to the enable signal AE. For example, the I/O unit 210 may selectively receive a digital input signal and output a digital output signal at the I/O terminal I/O. At the same time, in a state where the enable signal ENB has a logic level 0, the I/O unit 210 may output the output signal OUT at the I/O terminal I/O according to the enable signal ENB after the I/O unit 210 receives an output signal OUT. On the other hand in a state where enable signal ENB has a logic level 1, the I/O unit 210 may further transmit the digital input signal received at the input/output terminal I/O to an input terminal IN according to the enable signal ENB.

Moreover, a state where the enable signal AE has a logic level 1, the I/O unit 210 may execute the transmission of analog signals according to the enable signal AE. At the same time, in a state where the enable signal ENB has a logic level 1, the I/O unit 210 may further transmit an analog input signal received at an analog input terminal AS to the input terminal IN according to the enable signal ENB. Therefore in a state where both the enable signals AE and ENB have a logic level 1, the I/O unit 210 may be controlled by the enable signals AE and ENB when the power-off state resumes to the power-on state in order to immediately receive and transmit the analog input signal to the input terminal IN instead of first passing through the digital-processing stage.

In some embodiments, the internal circuit architecture of the I/O unit 210 is as illustrated in FIG. 2, but the present disclosure is not limited thereto. The operation related to coordination between the internal circuit of the I/O unit 210 and the above-mentioned enable signals RE and ENB is known to a person having ordinary skill in the art, and so a detailed description in this regard will not be provided.

The logic level of the above-mentioned enable signals AE and ENB corresponding to the operation of the I/O unit 210 is just an example, and should not limit this disclosure. In other words, a person having ordinary skill in the art could utilize different logic levels to control the operation of the I/O unit 210, depending on actual requirements.

Figure 3:
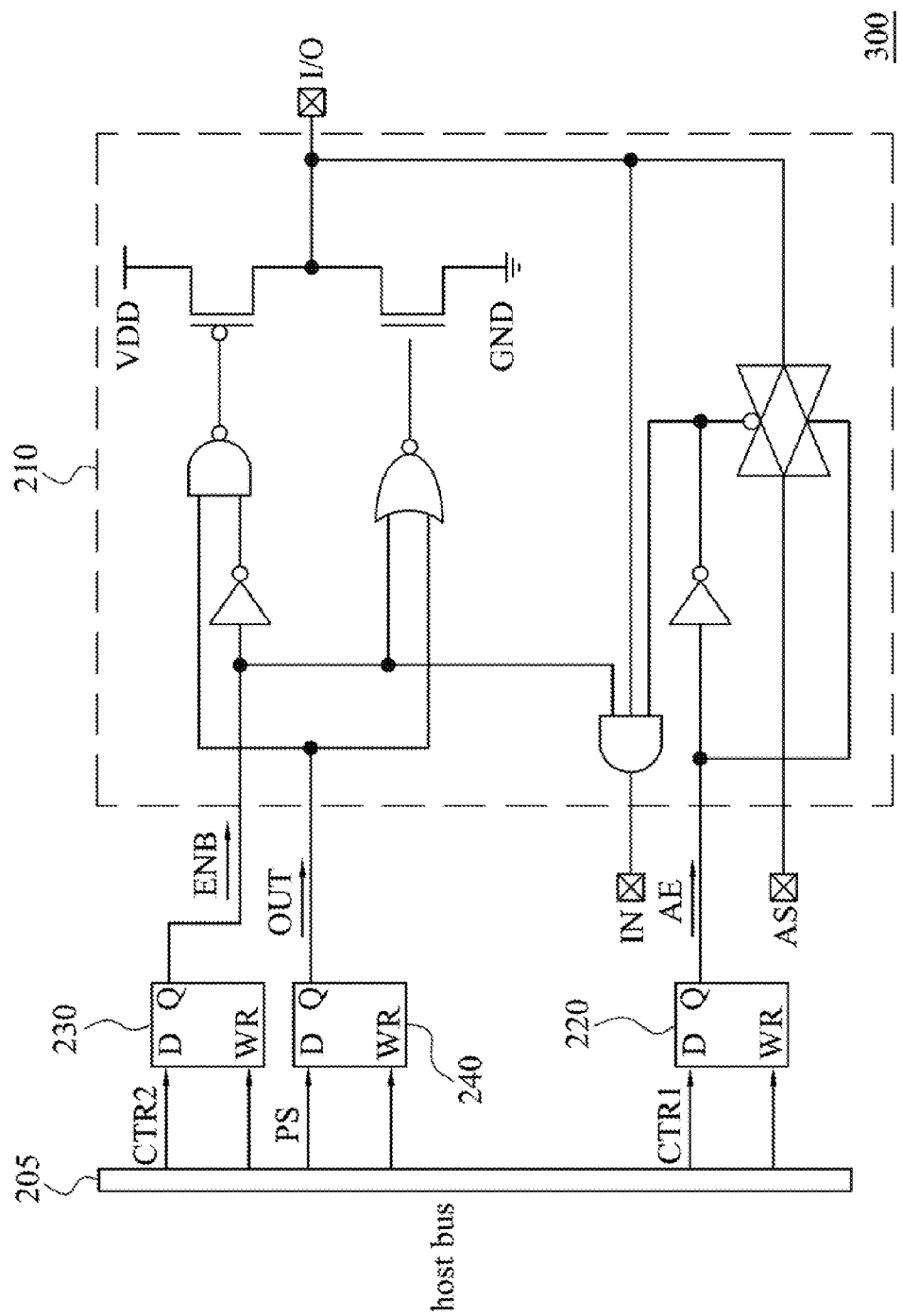
FIG. 3 is a schematic circuit diagram illustrating another input/output buffer circuit according to embodiments of this disclosure.

FIG. 3 is a schematic circuit diagram illustrating another input/output buffer circuit according to embodiments of this disclosure. The I/O buffer circuit 300 illustrated in FIG. 3 may similarly be implemented in the circuit system 100 illustrated in FIG. 1 but is not limited thereto. Compared to the embodiment in FIG. 2, the I/O buffer circuit 300 illustrated in FIG. 3 may include a register 240, in which the register 240 may be configured to output the output signal OUT to the I/O unit 210 when the power-off state resumes to the power-on state. In some embodiments, the register 240 may be configured to receive a process signal PS from the host bus 205, latch the process signal PS before power is turned off, and output the output signal OUT corresponding to the process signal PS when power is turned on, such that the I/O unit 210 outputs the output signal OUT at the I/O terminal I/O according to the enable signals AE and ENB. Consequently, the I/O unit 210 may immediately output the output signal OUT corresponding to the last operation stage when the power-off state resumes to the power-on state, such that the overall system may continue the signal processing of the last operation stage to thereby save time associated with signal resetting and signal processing.

In some embodiments, at least one of above-mentioned registers 220, 230 and 240 is a non-volatile register (NVR). In further embodiments, each of the registers 220, 230 and 240 is an NVR.

In other embodiments, at least one of the above-mentioned registers 220, 230 and 240 includes a resistive RAM (ReRAM). In a further embodiment, each of the above-mentioned registers 220, 230 and 240 comprises a ReRAM element.

Figure 4:
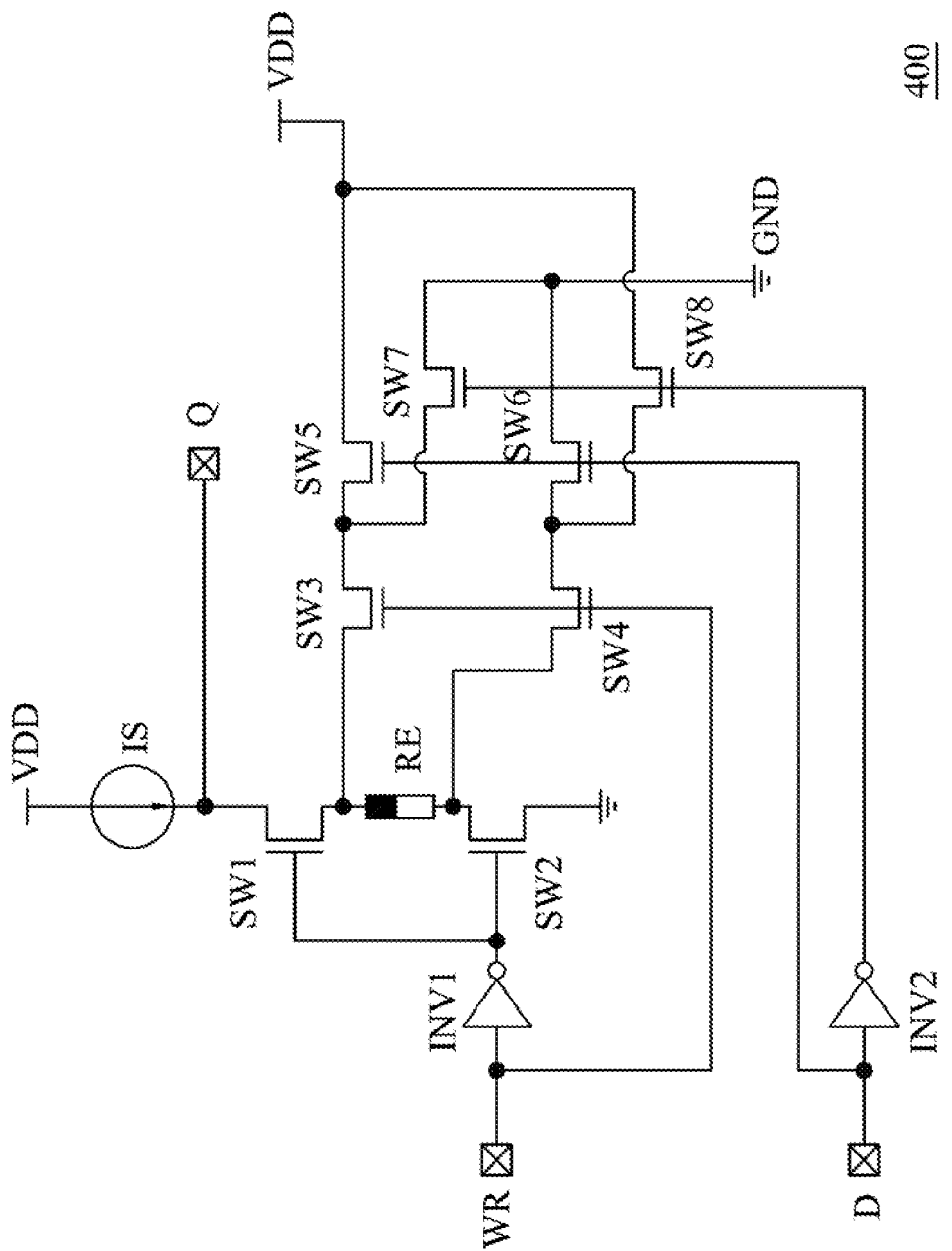
FIG. 4 is a schematic circuit diagram illustrating a register as illustrated in FIG. 2 or in FIG. 3 according to embodiments of this disclosure.

FIG. 4 is a schematic circuit diagram illustrating the register illustrated in FIG. 2 or in FIG. 3, according to embodiments of this disclosure. In some embodiments, the register 400 illustrated in FIG. 4 may be applied to at least one of the registers 220, 230 and 240 illustrated in FIG. 3. In other embodiments, the register 400 illustrated in FIG. 4 is applied to each of the registers 220, 230 and 240 in FIG. 3.

As illustrated in FIG. 4, the register 400 includes a current source IS, switches SW1~SW8, inverters INV1, INV2 and a resistive random access memory element RE. A first terminal of the switch SW1 is electrically coupled with the current source IS at a register output terminal Q. A first terminal of the resistive random access memory element RE is electrically coupled with a second terminal of the switch SW1. A first terminal of the SW2 is electrically coupled with a second terminal of the resistive random access memory element RE. An output terminal of inverter INV1 is electrically coupled with control terminals of the switch SW1 and SW2. An input terminal of the inverter INV1 is electrically coupled with a register control terminal WR. A first terminal of the switch SW3 is electrically coupled with the first terminal of the resistive random access memory element RE. A first terminal of the switch SW4 is electrically coupled with the second terminal of the resistive random access memory element RE, and control terminals of the switches SW3 and SW4 are electrically coupled with the register control terminal WR. A first terminal of the switch SW5 is electrically coupled with a second terminal of the switch SW3. A second terminal of the switch SW5 is configured to receive a power voltage VDD, and a control terminal of the switch SW5 electrically coupled with a register input terminal D. A first terminal of the switch SW6 is electrically coupled with a second terminal of the switch SW4, and a second terminal of the switch SW6 is electrically coupled with a reference voltage GND (for example, a grounding voltage), and a control terminal of the switch SW6 is electrically coupled with the register input terminal D. A first terminal of the switch SW7 is electrically coupled with the second terminal of the switch SW3, and a second terminal of the switch SW7 is configured to receive the reference voltage GND. The first terminal of the switch SW8 is electrically coupled with the second terminal of the switch SW4, and a second terminal of the switch SW8 is configured to receive the power voltage VDD. An output terminal of the inverter INV2 is electrically coupled with the control terminals of the switches SW7 and SW8, and an input terminal of the inverter INV2 is electrically coupled with the register input terminal D.

In operation, when a signal with a logic level 1 is transmitted to the register control terminal WR, the output terminal of the inverter INV1 has a logic level 0, the switches SW1 SW2 are turned off, and the switches SW3, SW4 are turned on. When a signal with a logic level 1 is transmitted to the register input terminal D, the output terminal of the inverter INV2 has a logic level 0, the switches SW7, SW8 are turned off, and the switches SW5, SW6 are turned on, such that the first terminal of the resistive random access memory element RE receives the power voltage VDD and the second terminal of the resistive random access memory element RE receives the reference voltage GND. At the same time, the resistive random access memory element RE is at a relatively high-resistive state, which correspond to logic level 1. That is, the resistive random access memory element RE temporarily stores a signal corresponding to logic level 1.

On the other hand, in a state where the switches SW3 and SW4 are turned on, when a signal with a logic level 0 is transmitted to register input terminal D, the output terminal of the inverter INV2 has a logic level 1, the switches SW7, SW8 are turned on and the switches SW5, SW5 are turned off, such that the first terminal of the resistive random access memory element RE receives the reference voltage GND and the second terminal of the resistive random access memory element RE receives the power voltage VDD. At the same time, the resistive random access memory element RE is at a relatively low-resistive state, which corresponds to logic level 0. That is the resistive random access memory element RE temporarily stores a signal corresponding to logic level 0.

In addition, when a signal with a logic level 1 is transmitted to the register control terminal WR, the output terminal of the inverter INV1 has a logic level 0, the switches SW1, SW2 are turned off, and the register output terminal Q outputs a signal corresponding to the power voltage VDD. On the other hand, when a signal with a logic level 0 is transmitted to the register control terminal WR, the output terminal of the inverter INV1 has a logic level 9, and the switches SW1, SW2 are turned on. At the same time, the signal with a logic level 0 or 1 temporarily stored in the resistive random access memory element RE is outputted through the register output terminal Q.

According to the description provided above, by the configuration of the above-mentioned resistive random access memory element RE in the register, signals corresponding to the last operation stage of the register may be temporarily stored in the resistive random access memory element RE, such that the signal processing of the last operation stage could be stored in the resistive random access memory element RE. Moreover, the register 400 and the resistive random access memory element RE may immediately start up and continue the signal processing of the last operation stage when being resumed from the power-off state to the power-on state, as to save time associated with signals resetting and to avoid malfunctioning resulting from the chip being unable to immediately perform analog processing when power resumes.

As mentioned above, the register 400 in FIG. 4 may be applied to at least one of the registers 220, 230 and 240 in FIG. 3. By temporarily storing or latching the operation signal corresponding to the last operation stage, the input/output unit 210 is able to immediately continue signal processing of the last operation stage when a power-off state resumes to a power-on state, and can process analog signals immediately without passing through the digital processing stage.

According to the above embodiments, the I/O buffer circuit applied above is able to directly transmit analog signals when changed from the power-off state to the power-on state without passing through the digital-processing stage, thereby avoiding malfunctioning in processing signals. In addition, the I/O buffer circuit applied above is further able to continue signal processing of the last operation stage to save time associated with signal resetting and processing.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An input/output (I/O) buffer circuit comprising:
    an I/O unit configured to selectively transmit digital signals and analog signals according to a first enable signal, and selectively receive signals and output signals at an I/O terminal according to a second enable signal;
    a first register configured to latch a first control signal received before power is turned off, and output the first enable signal corresponding to the first control signal to the I/O unit when power is turned on, wherein the first register is a non-volatile register;
    a second register configured to latch a second control signal received before power is turned off, and output the second enable signal corresponding to the second control signal to the I/O unit when power is turned on, wherein the second register is a non-volatile register;
    a first resistive random access memory element configured to temporarily store the first control signal received by the first register into a first resistive state before power is turned off, and the first resistive random access memory element is disposed inside the first register, wherein the power is turned on, the first register transforms the first resistive state into the first enable signal, and outputs the first enable signal which is corresponding to the first control signal to the I/O unit;
    a second resistive random access memory element configured to temporarily store the second control signal received by the second register into a second resistive state before power is turned off, and the second resistive random access memory element is disposed inside the second register, wherein the power is turned on, the second register transforms the second resistive state into the second enable signal, and outputs the second enable signal which is corresponding to the second control signal to the I/O unit; and
    a third register configured to latch a process signal received before power is turned off, and output an output signal corresponding to the process signal to the I/O unit when power is turned on, such that the I/O unit outputs the output signal at the I/O terminal according to the first enable signal and the second enable signal.

2. The I/O buffer circuit of claim 1, wherein the third register is a non-volatile register.

3. The I/O buffer circuit of claim 1, wherein the third register comprises a third resistive random access memory element.

4. The I/O buffer circuit of claim 1, wherein the I/O unit is configured to selectively receive a digital input signal and output a digital output signal at the I/O terminal in a state where the first enable signal has a first logic level, and receive and deliver an analog input signal to an input terminal in a state where the first enable signal has a second logic level.

5. The I/O buffer circuit of claim 1, wherein the I/O unit is configured to selectively receive a digital input signal and output a digital output signal at the I/O terminal in a state where the first enable signal has a first logic level, and receive and deliver an analog input signal to an input terminal in a state where the first enable signal has a second logic level.

6. The I/O buffer circuit of claim 2, wherein the I/O unit is configured to selectively receive a digital input signal and output a digital output signal at the I/O terminal in a state where the first enable signal has a first logic level, and receive and deliver an analog input signal to an input terminal in a state where the first enable signal has a second logic level.

7. The I/O buffer circuit of claim 3, wherein the I/O unit is configured to selectively receive a digital input signal and output a digital output signal at the I/O terminal in a state where the first enable signal has a first logic level, and receive and deliver an analog input signal to an input terminal in a state where the first enable signal has a second logic level.

8. An input/output (I/O) buffer circuit comprising:
    a first non-volatile register configured to output a first enable signal when a power-off state resumes to a power-on state;
    a second non-volatile register configured to output a second enable signal when the power-off state resumes to the power-on state;
    an I/O unit, in a state where the first enable signal and the second enable signal separately have a predetermined logic level, configured to be controlled by the first enable signal and the second enable signal to receive and deliver an analog input signal to an input terminal when the power-off state resumes to the power-on state;
    a first resistive random access memory element configured to temporarily store the first control signal received by the first non-volatile register into a first resistive state before power is turned off, and the first resistive random access memory element is disposed inside the first non-volatile register, wherein the power is turned on, the first non-volatile register transforms the first resistive state into the first enable signal, and outputs the first enable signal which is corresponding to the first control signal to the I/O unit;
    a second resistive random access memory element configured to temporarily store the second control signal received by the second non-volatile register into a second resistive state before power is turned off, and the second resistive random access memory element is disposed inside the second non-volatile register, wherein the power is turned on, the second non-volatile register transforms the second resistive state into the second enable signal, and outputs the second enable signal which is corresponding to the second control signal to the I/O unit; and a third non-volatile register configured to output an output signal to the I/O unit when the power-off state resumes to the power-on state, such that the I/O unit outputs the output signal at an I/O terminal according to the first enable signal and the second enable signal.

9. The I/O buffer circuit of claim 8, wherein the third non-volatile register comprises a third resistive random access memory element.

10. The I/O buffer circuit of claim 8, wherein at least one of the first non-volatile register, the second non-volatile register and the third non-volatile register comprises:
a current source;
a first switch, wherein a first terminal of the first switch is electrically coupled with the current source at a register output terminal;
a resistive random access memory element, wherein a first terminal of the resistive random access memory element is electrically coupled with a second terminal of the first switch;
a second switch, wherein a first terminal of the second switch is electrically coupled with a second terminal of the resistive random access memory element;
a first inverter, wherein an output terminal of the first inverter is electrically coupled with control terminals of the first switch and the second switch, and an input terminal of the first inverter is electrically coupled with a register control terminal;
a third switch, wherein the a terminal of the third switch is electrically coupled with a first terminal of the resistive random access memory element, and a control terminal of the third switch is electrically coupled with the register control terminal;
a fourth switch, wherein a first terminal of the fourth switch is electrically coupled with a second terminal of the resistive random access memory element, and a control terminal of the fourth switch is electrically coupled with the register control terminal;
a fifth switch, wherein a first terminal of the fifth switch is electrically coupled with a second terminal of the third switch, and a second terminal of the fifth switch is configured to receive a power voltage, and a control terminal of the fifth switch is electrically coupled with a register input terminal;
a sixth switch, wherein a first terminal of the sixth switch is electrically coupled with a second terminal of the fourth switch, and a second terminal of the sixth switch is configured to receive a reference voltage, and a control terminal of the sixth switch is electrically coupled with the register input terminal;
a seventh switch, wherein a first terminal of the seventh switch is electrically coupled with a second terminal of the third switch, and a second terminal of the seventh switch is configured to receive the reference voltage;
an eighth switch, wherein a first terminal of the eighth switch is electrically coupled with a second terminal of the fourth switch, and a second terminal of the eighth switch is configured to receive the power voltage; and
a second inverter, wherein an output terminal of the second inverter is electrically coupled with the control terminals of the seventh switch and the eighth switch, and an input terminal of the second inverter is electrically coupled with the register input terminal.

11. The I/O buffer circuit of claim 8, wherein the first non-volatile register and the second non-volatile register are configured to separately latch the first control signal and the second control signal before power is turned off, and separately output the first enable signal and the second enable signal respectively corresponding to the first control signal and the second control signal when the power-off state resumes to the power-on state.

12. The I/O buffer circuit of claim 8, wherein the first non-volatile register and the second non-volatile register are configured to separately latch the first control signal and the second control signal before power is turned off, and separately output the first enable signal and the second enable signal respectively corresponding to the first control signal and the second control signal when the power-off state resumes to the power-on state.

13. The I/O buffer circuit of claim 9, wherein the first non-volatile register and the second non-volatile register are configured to separately latch the first control signal and the second control signal before power is turned off, and separately output the first enable signal and the second enable signal respectively corresponding to the first control signal and the second control signal when the power-off state resumes to the power-on state.

14. The I/O buffer circuit of claim 10, wherein the first non-volatile register and the second non-volatile register are configured to separately latch the first control signal and the second control signal before power is turned off, and separately output the first enable signal and the second enable signal respectively corresponding to the first control signal and the second control signal when the power-off state resumes to the power-on state.

* * * * *